US008519279B2

(12) United States Patent
Chang et al.

(10) Patent No.: US 8,519,279 B2
(45) Date of Patent: Aug. 27, 2013

(54) PORTABLE ELECTRONIC DEVICE WITH INTERFACE

(75) Inventors: Chih-Wei Chang, Shindian (TW); Bhoopal Ponnuvelu, Shenzhen (CN)

(73) Assignee: FIH (Hong Kong) Limited, Kowloon (HK)

( * ) Notice: Subject to any disclaimer, the term of this patent is extended or adjusted under 35 U.S.C. 154(b) by 184 days.

(21) Appl. No.: 13/036,107

(22) Filed: Feb. 28, 2011

(65) Prior Publication Data

US 2012/0125942 A1 May 24, 2012

(30) Foreign Application Priority Data

Nov. 19, 2010 (CN) .......................... 2010 1 0551154

(51) Int. Cl.
*H05K 5/06* (2006.01)

(52) U.S. Cl.
USPC ........... 174/564; 439/278; 439/281; 174/559; 174/560

(58) Field of Classification Search
USPC ..... 174/564, 559, 560, 50.5–50.53; 361/816, 361/818, 649.55–679.56; 439/281, 278
See application file for complete search history.

(56) References Cited

U.S. PATENT DOCUMENTS

| | | | | |
|---|---|---|---|---|
| 7,282,533 | B2 * | 10/2007 | Kreitschmann et al. | 524/590 |
| 8,066,518 | B2 * | 11/2011 | Homme et al. | 439/78 |
| 8,284,550 | B2 * | 10/2012 | Wang | 361/679.3 |
| 2011/0076883 | A1 * | 3/2011 | Jol | 439/521 |

* cited by examiner

*Primary Examiner* — Hoa C Nguyen
*Assistant Examiner* — Amol Patel
(74) *Attorney, Agent, or Firm* — Altis Law Group, Inc.

(57) ABSTRACT

An electronic device includes a housing defining an opening; a sealing assembly including a main body and a sealing element mounted on the main body; the sealing element comprising a first sealing portion and a second sealing portion; the main body having a compartment, a hole and a first mounting hole; the hole and the first mounting hole respectively defined at opposite ends of the main body; and the hole aligned with the opening; and an interface mounted to the first mounting hole. The first sealing portion and the second sealing portion are both made of resilient material, the first sealing portion located between the housing and the main body to seal a first gap occurring between the housing and the main body, and the second sealing portion surrounding an inner surface of the first mounting hole to seal a second gap occurring between the interface and the main body.

12 Claims, 8 Drawing Sheets

PORTABLE ELECTRONIC DEVICE WITH INTERFACE

BACKGROUND

1. Technical Field

The exemplary disclosure generally relates to portable electronic devices, particularly to portable electronic devices with external interfaces.

2. Description of Related Art

Electronic devices often provide an external port, interface, or connector on an outer sidewall of a housing enabling connection to a peripheral device, accessory or network. However, gaps between the interface and the housing can allow intrusion of moisture or debris, affecting the device interior.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary portable electronic device with an interface. Moreover, in the drawings like reference numerals designate corresponding parts throughout the several views. Wherever possible, the same reference numbers are used throughout the drawings to refer to the same or like elements of an embodiment.

DETAILED DESCRIPTION

In this exemplary embodiment, the device is an electronic device such as a mobile telephone but any device employing an interface is applicable. Accordingly, any reference herein to the mobile telephone should also be considered to apply equally to other portable devices.

Figure 1:
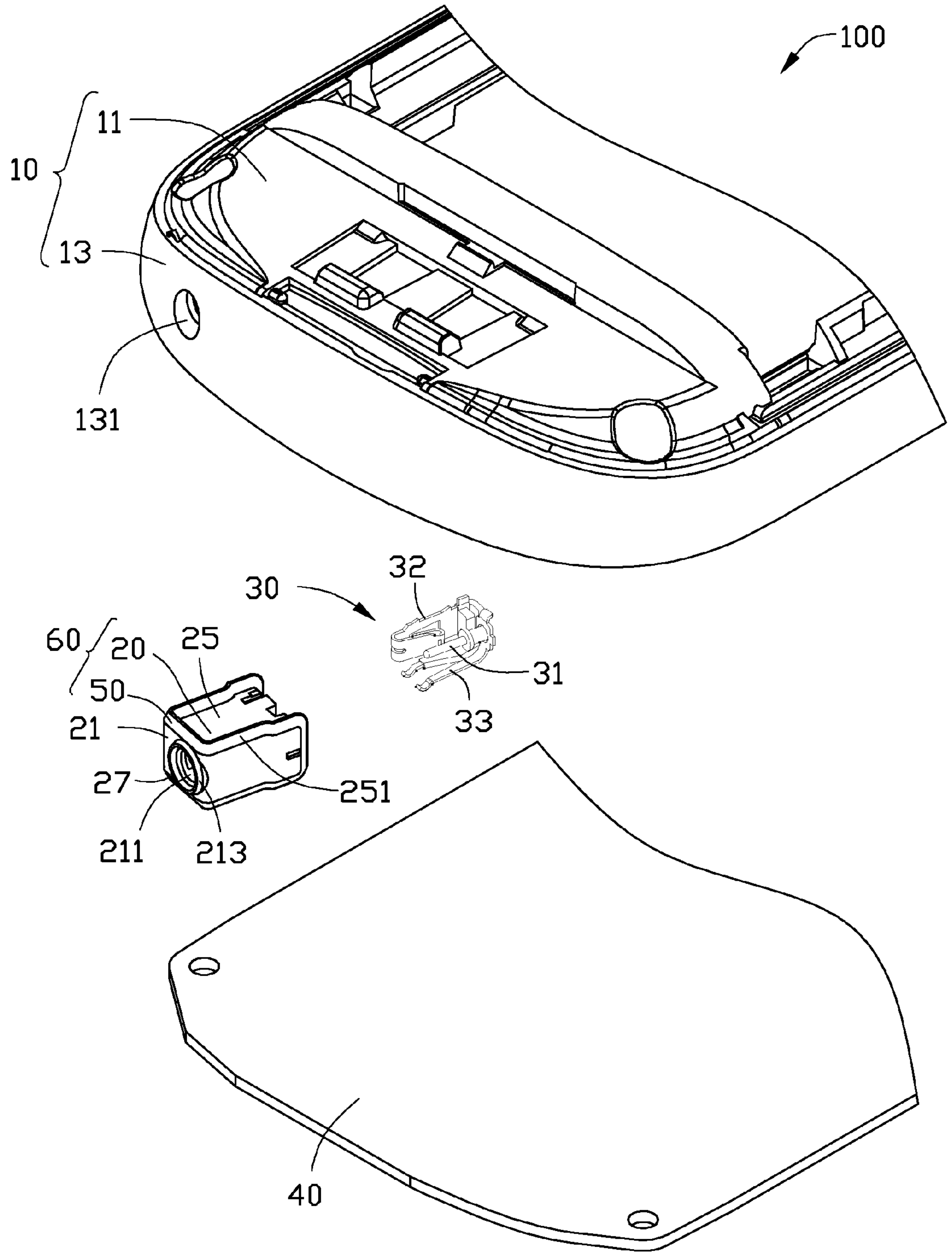
FIG. 1 is an exploded view of an exemplary embodiment of an electronic device including a housing, an interface, a sealing assembly and a circuit board.

Referring to FIG. 1, an exemplary electronic device 100 includes a housing 10, a sealing assembly 60, an interface 30, and a circuit board 40. The interface 30 may be a power connector or a USB connector. The interface 30 is received in the sealing assembly 60 and electrically connected to the circuit board 40. The sealing assembly 60 and the circuit board 40 are both mounted on the housing 10. The sealing assembly 60 includes a main body 20 and a sealing element 50. The sealing assembly 60 is resilient and seals gaps occurring between the main body 20, the interface 30, the housing 10, and the circuit board 40.

Figure 2:
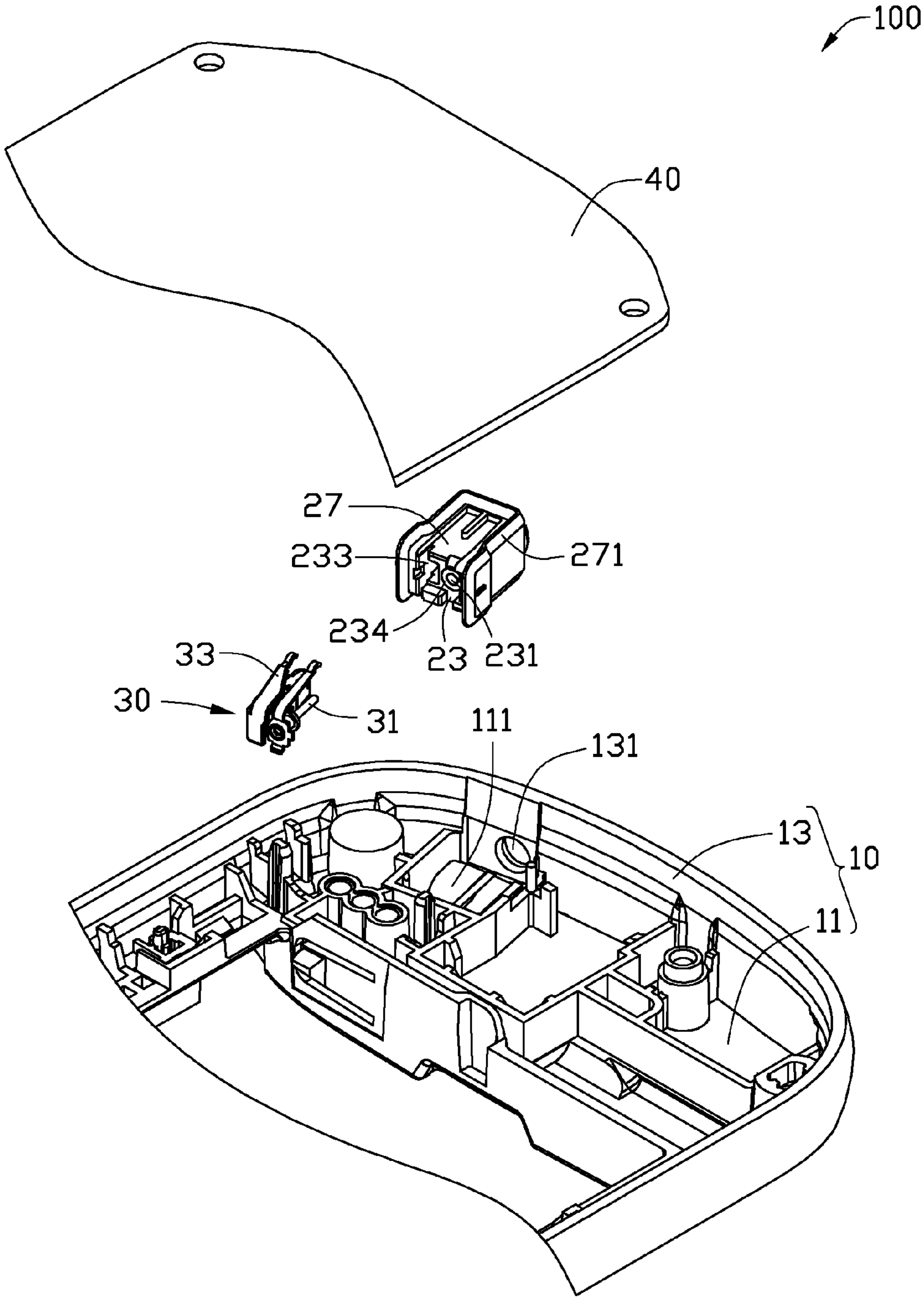
FIG. 2 is another exploded view of the electronic device of FIG. 1 from another aspect.

Referring to FIG. 2, the housing 10 includes a bottom surface 11 and a peripheral wall 13 protruding from a peripheral edge thereof. The bottom surface 11 defines a mounting groove 111 near the peripheral wall 13 receiving the sealing assembly 60 and the interface 30 therein. The peripheral wall 13 defines an opening 131 communicating with the mounting groove 111. The opening 131 allows passage of peripheral device connectors therethrough, to link with the interface 30.

Figure 3:
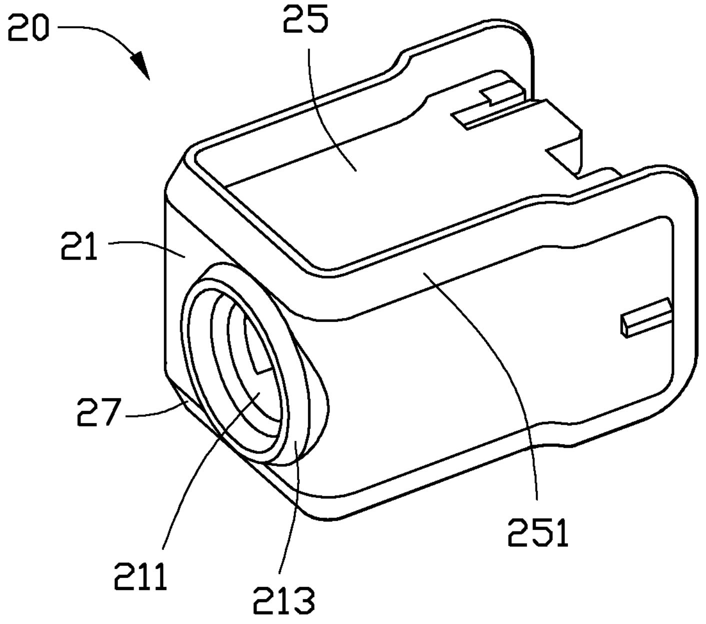
FIG. 3 is an enlarged view of the interface of FIG. 1.
Figure 4:
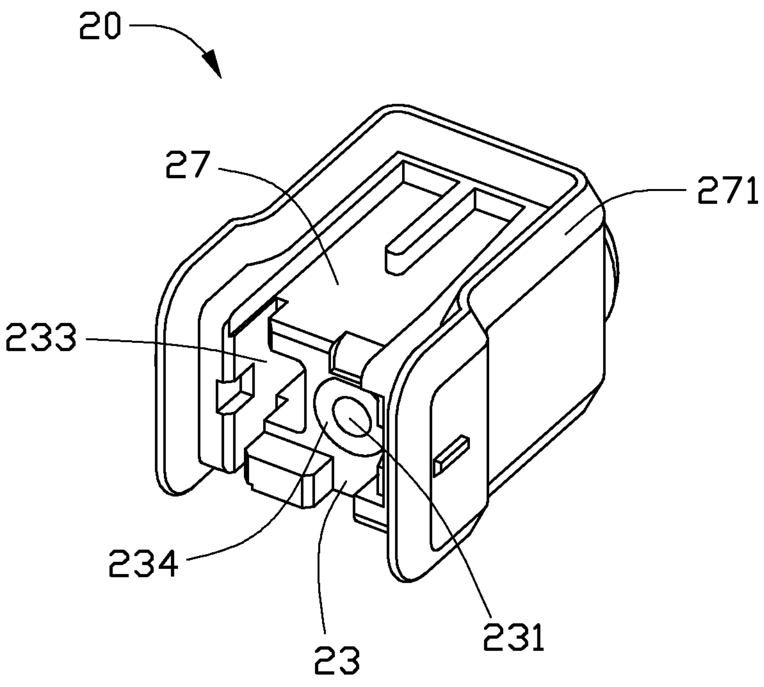
FIG. 4 is another enlarged view of the interface of FIG. 1 from another aspect.
Figure 5:
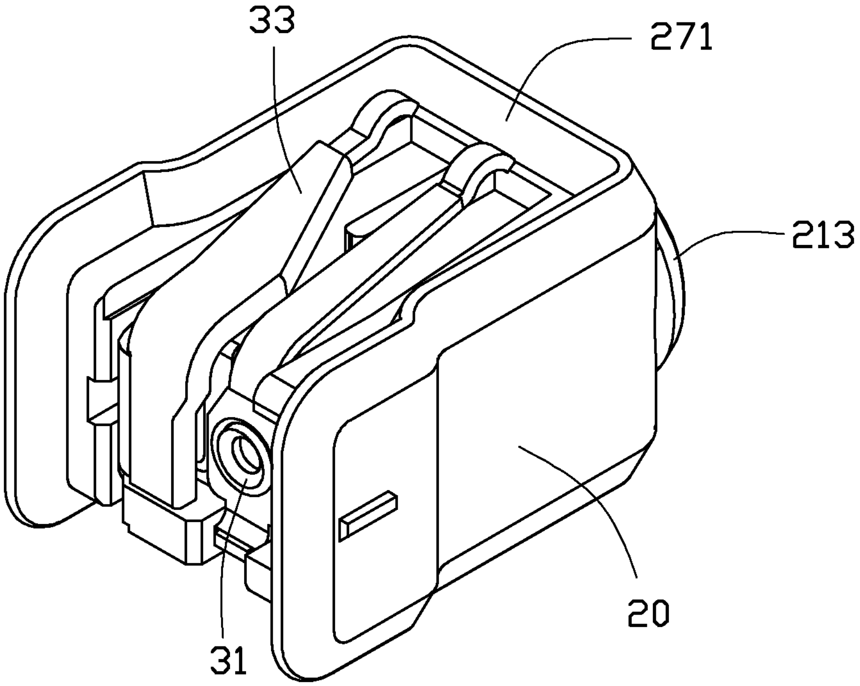
FIG. 5 is an enlarged view of the interface assembled with the connector.
Figure 6:
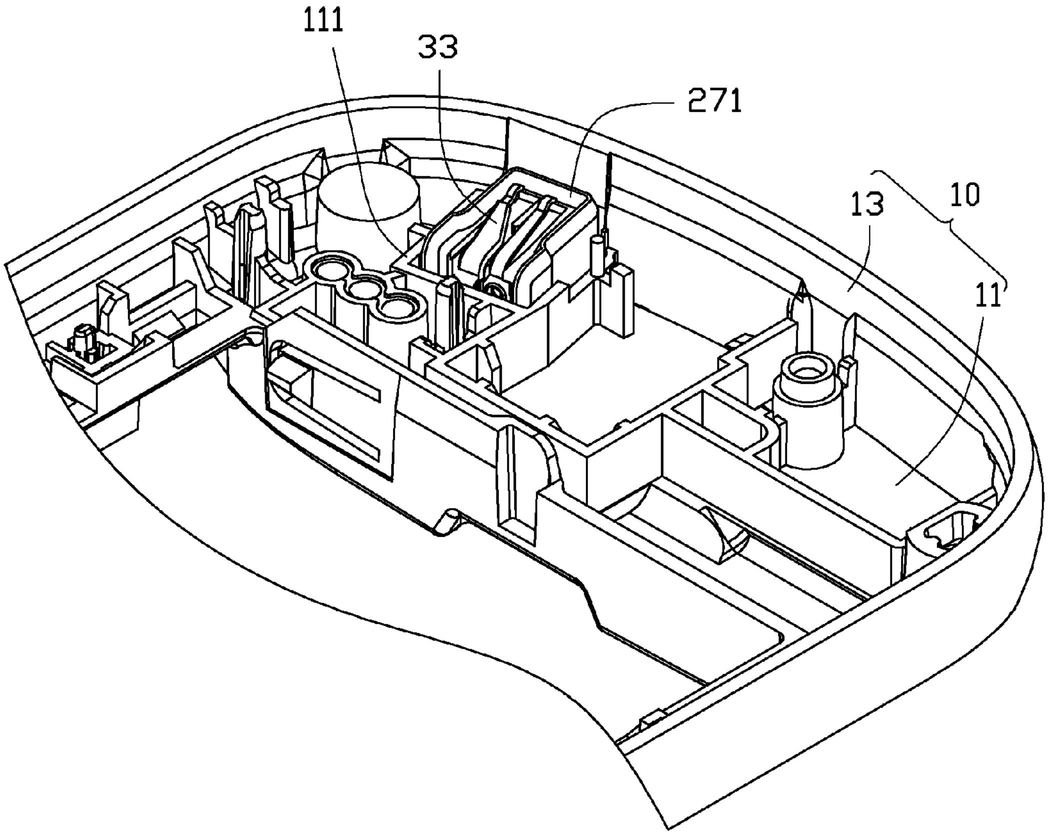
FIG. 6 is an assembled view of the electronic device shown in FIG. 2 with the circuit board absent.
Figure 7:
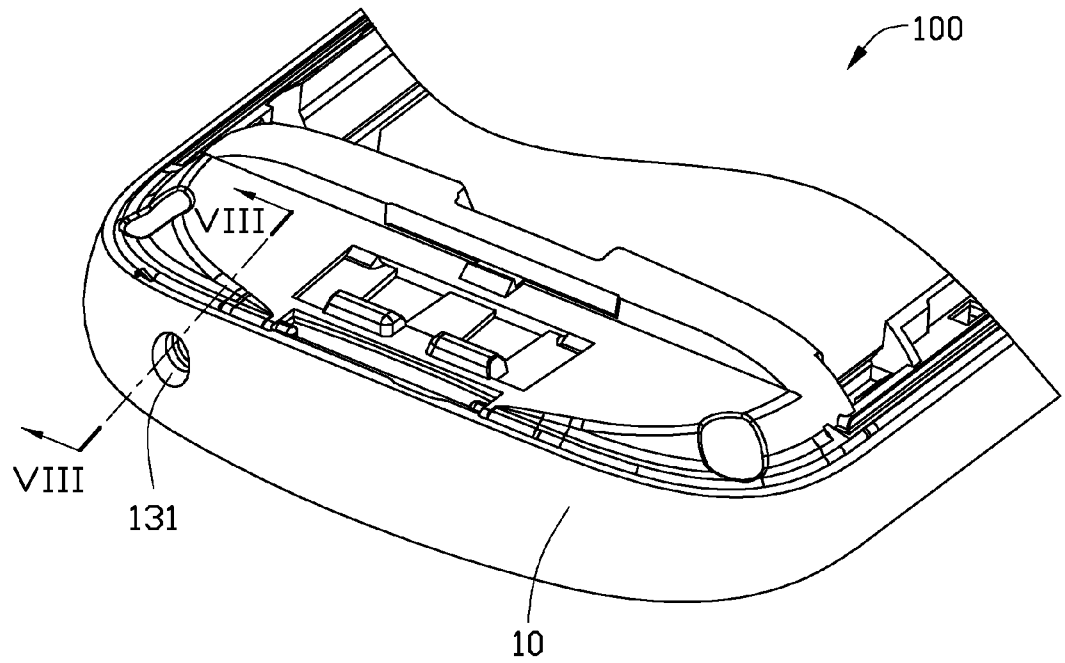
FIG. 7 is an assembled view of the electronic device shown in FIG. 1.
Figure 8:
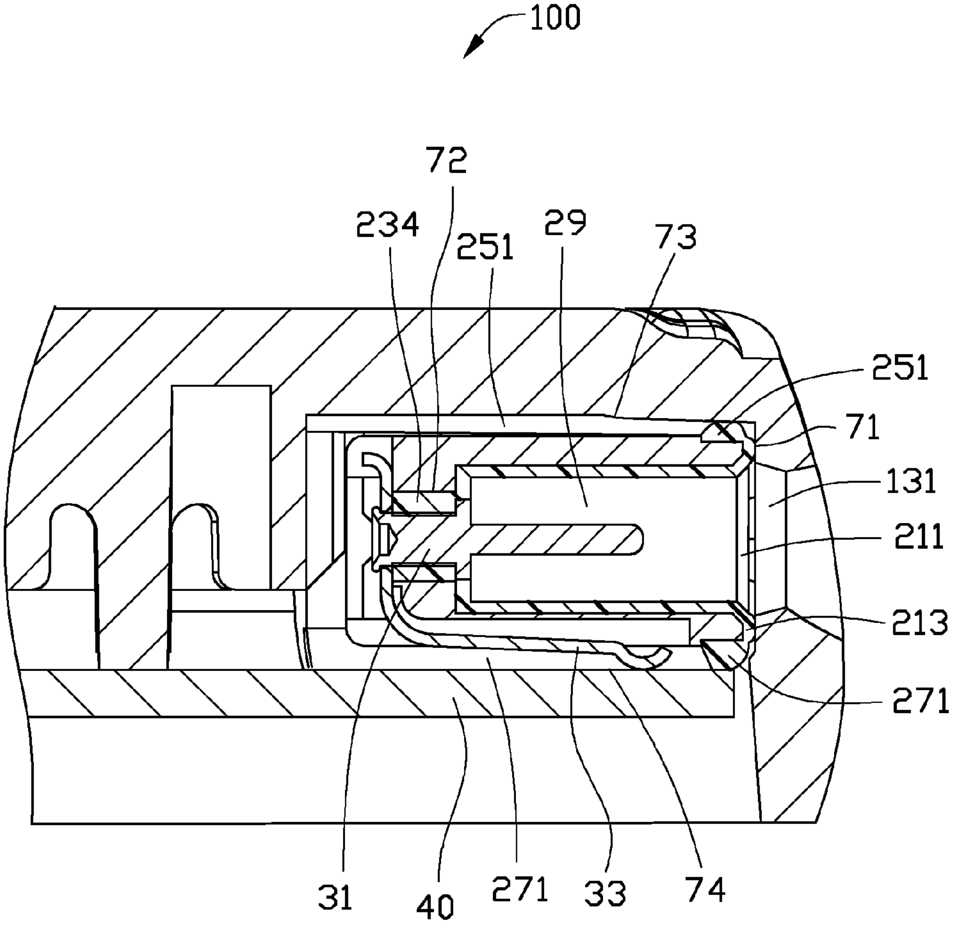
FIG. 8 is a cross-section of the electronic device shown in FIG. 7 along the line of VIII-VIII.

Referring to FIGS. 3 and 4, the main body 20 is hollow and defines a compartment 29 (see FIG. 8). The compartment 29, in this exemplary embodiment, is enclosed by a first end wall 21, a second end wall 23, a first board 25 and a second board 27. The first end wall 21 faces the opening 131, and the second end wall 23 is opposite to the first end wall 21. The first board 25 faces the bottom surface 11 of the housing 10, and the second board 27 is opposite to the first board 25. The first board 25 and the second board 27 respectively connect the first end wall 21 with the second end wall 23.

The first end wall 21 defines a hole 211 communicating with the compartment 29. The hole 211 is aligned with the opening 131 when the sealing assembly 60 is mounted to the housing 10. The second end wall 23 defines a first mounting hole 231 and a second mounting hole 233 therein, both of which communicate with the compartment 29. The interface 30 passes through the first mounting hole 231 and the second mounting hole 233, and into the compartment 29.

Referring to FIGS. 3-4, and 8, the sealing element 50 includes a first sealing portion 213, a second sealing portion 234, a third sealing portion 251 and a fourth sealing portion 271. The first sealing portion 213 is located between the first end wall 21 and the peripheral wall 13 to seal a first gap 71 occurring between the first end wall 21 and the peripheral wall 13. The second sealing portion 234 is located between the first mounting hole 231 and the interface 30 to seal a second gap 72 occurring between the first mounting hole 231 and the interface 30. The third sealing portion 251 is located between the first board 25 and the bottom surface 11 to seal a third gap 73 occurring between the first board 25 and the bottom surface 11. The fourth sealing portion 271 is located between the second board 27 and the circuit board 40 to seal a fourth gap 74 occurring between the second board 27 and the circuit board 40.

In this exemplary embodiment, the first sealing portion 213 surrounds the hole 211. The second sealing portion 234 is tubular, and received in and surrounds the first mounting hole 231. The third sealing portion 251 is U-shaped and extends from the edge of the first board 25 (See FIG. 3). The fourth sealing portion 271 is U-shaped and extends from the edge of the second board 27 (See FIG. 4).

The first sealing portion 213, the second sealing portion 234, the third sealing portion 251 and the fourth sealing portion 271 may be all made of resilient material, such as thermoplastic polyurethane (TPU). The main body 20 may be made of polycarbonate (PC). The interface 30 includes a retaining portion 31, a first resilient arm 32 and a second resilient arm 33. The retaining portion 31 is received in the first mounting hole 231 to mount the interface 30 to the main body 20. The retaining portion 31 and the first resilient arm 32 respectively pass through the first mounting hole 231 and the second mounting hole 233, and then into the compartment 29. The first resilient arm 32 provides electrical connection with the peripheral devices. The second resilient arm 33 provides electrical connection with the circuit board 40.

Referring to FIGS. 1, 2, 5 and 8, in assembly, the retaining portion 31 and the first resilient arm 32 respectively pass through the first mounting hole 231 and the second mounting hole 233 to mount the interface 30 to the sealing assembly 60. At this time, the second sealing portion 234 is elastically compressed and tightly resists the retaining portion 31, such that the first mounting hole 231 is sealed. The sealing assembly 60 is then received in the mounting groove 111 with the hole 211 aligned with the opening 131. At this time, the first sealing portion 213 is elastically compressed and tightly resists an inner surface of the opening 131 to seal the first gap 71 between the main body 20 and the housing 10, and the fourth sealing portion 271 elastically resists an inner surface of the mounting groove 111. The circuit board 40 is mounted to the housing 10 and electrically connects to the second resilient arm 33 to yield an assembled electronic device. At this time, the fourth sealing portion 271 is elastically compressed between the circuit board 40 and the main body 20 to seal the fourth gap 74 between the main body 20 and the circuit board 40.

In the exemplary embodiment, the first sealing portion 213, the second sealing portion 234, the third sealing portion 251 and the fourth sealing portion 271 are all made of resilient material. When the sealing assembly 60 is mounted to the housing 10, the first sealing portion 213, the second sealing portion 234, the third sealing portion 251 and the fourth sealing portion 271 are elastically compressed, respectively resisting the peripheral wall 13, the retaining portion 31, the bottom surface 11 and the circuit board 40, tightly. Thus the first gap 71, the second gap 72, the third gap 73 and the fourth gap 74 are sealed to prevent entry of contaminants into the interior of the electronic device.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device, comprising:

a housing defining an opening;

a sealing assembly including a main body and a sealing element mounted on the main body; the sealing element comprising a first sealing portion, a second sealing portion, and a third sealing portion; the main body having a first board, a compartment, a hole and a first mounting hole; the hole and the first mounting hole respectively defined at opposite ends of the main body; and the hole aligned with the opening; and an interface mounted to the first mounting hole;

wherein the first sealing portion and the second sealing portion are both made of resilient material; the first sealing portion is located between the housing and the main body to seal a first gap occurring between the housing and the main body; the second sealing portion is received in the first mounting hole and surrounds an inner surface of the first mounting hole to seal a second gap occurring between the interface and the main body; the third sealing portion is mounted on a peripheral edge of the first board, and is located between the main body and the housing to seal a third gap occurring between the main body and the housing.

2. The electronic device of claim 1, wherein the resilient material is thermoplastic polyurethanes.

3. The electronic device of claim 2, wherein the main body is made of polycarbonate.

4. The electronic device of claim 1, further comprising a circuit board electrically connected to the interface; the main body further comprises a second board opposite to the first board and facing the circuit board, the sealing element further comprises a fourth sealing portion mounted an edge of the second board, the fourth sealing portion is located between the main body and the circuit board to seal a fourth gap occurring between the main body and the circuit board.

5. An electronic device, comprising:

a housing defining an opening;

a sealing assembly including a main body mounted on the housing and a sealing element mounted on the main body; the sealing element comprising a first sealing portion, a second sealing portion, and a third sealing portion; the main body having a first board, a compartment, a first mounting hole communicating with the compartment, and a hole communicating with the compartment, the hole aligned with the opening; and an interface received in the compartment the interface comprising a retaining portion retained in the first mounting hole;

wherein the first sealing portion and the second sealing portion are made of resilient material; the first sealing portion is simultaneously received in the opening and the hole to seal a first gap occurring between the housing and the main body; the second sealing portion is received in the first mounting hole and surrounds an inner surface of the first mounting hole to seal a second gap occurring between the retaining portion and the main body; the third sealing portion is mounted on an edge of the first board, and is located between the main body and the housing to seal a third gap occurring between the main body and the housing.

6. The electronic device of claim 5, wherein the resilient material is thermoplastic polyurethanes.

7. The electronic device of claim 6, wherein the main body is made of polycarbonate.

8. The electronic device of claim 5, further comprising a circuit board electrically connected to the interface; the main body further comprises a second board opposite to the first board and facing the circuit board, the sealing element further comprises a fourth sealing portion mounted an edge of the second board, the fourth sealing portion is located between the main body and the circuit board to seal a fourth gap occurring between the main body and the circuit board.

9. The electronic device of claim 1, wherein the third sealing portion is U-shaped and protrudes from the peripheral edge of the first board.

10. The electronic device of claim 4, wherein the fourth sealing portion is U-shaped and protrudes from the edge of the second board.

11. The electronic device of claim 5, wherein the third sealing portion is U-shaped and protrudes from the peripheral edge of the first board.

12. The electronic device of claim 8, wherein the fourth sealing portion is U-shaped and protrudes from the edge of the second board.

* * * * *